United States Patent
Balakrishnan et al.

(10) Patent No.: US 8,609,461 B1
(45) Date of Patent: Dec. 17, 2013

(54) SEMICONDUCTOR EPITAXY ON DIAMOND FOR HEAT SPREADING APPLICATIONS

(75) Inventors: Ganesh Balakrishnan, Albuquerque, NM (US); Jerome V. Moloney, Tucson, AZ (US); Victor Hasson, La Jolla, CA (US)

(73) Assignee: STC.UNM, Albuquerque, NM (US)

( * ) Notice: Subject to any disclaimer, the term of this patent is extended or adjusted under 35 U.S.C. 154(b) by 170 days.

(21) Appl. No.: 12/777,907

(22) Filed: May 11, 2010

Related U.S. Application Data

(60) Provisional application No. 61/216,004, filed on May 11, 2009.

(51) Int. Cl.
*H01L 29/72* (2006.01)

(52) U.S. Cl.
USPC ............ 438/105; 438/459; 438/473; 257/615

(58) Field of Classification Search
USPC .......................... 438/105, 459, 473; 257/615
See application file for complete search history.

(56) References Cited

U.S. PATENT DOCUMENTS

| | | | | |
|---|---|---|---|---|
| 5,030,583 | A * | 7/1991 | Beetz, Jr. ...................... | 438/105 |
| 7,341,927 | B2 * | 3/2008 | Atwater et al. ................ | 438/473 |
| 7,535,100 | B2 * | 5/2009 | Kub et al. ...................... | 257/728 |

* cited by examiner

*Primary Examiner* — Edward Wojciechowicz
(74) *Attorney, Agent, or Firm* — MH2 Technology Law Group, LLP

(57) ABSTRACT

Various embodiments provide methods for forming a diamond heat spreader and integrating the diamond heat spreader with a heat source without generating voids at the interface. In one embodiment, a semiconductor layer can be epitaxially formed on a diamond substrate having a desirably low surface root mean square (RMS) roughness. The semiconductor epi-layer can be used as an interface layer for bonding the diamond substrate to the heat source to provide efficient heat spreading.

20 Claims, 1 Drawing Sheet

100A

100B

100C

SEMICONDUCTOR EPITAXY ON DIAMOND FOR HEAT SPREADING APPLICATIONS

RELATED APPLICATIONS

This application claims priority from U.S. Provisional Patent Application Ser. No. 61/216,004, filed May 11, 2009, which is hereby incorporated by reference in its entirety.

GOVERNMENT RIGHTS

This invention was made with Government support under Contract No. FA9550-07-1-0573 awarded by the Air Force Office of Scientific Research (AFOSR). The U.S. Government has certain rights in this invention.

FIELD OF THE INVENTION

This invention relates generally to semiconductors and, more particularly, to materials and methods for semiconductor epitaxy on diamond for heat spreading applications.

BACKGROUND OF THE INVENTION

Conventional thermal management in high power semiconductor devices includes a diamond heat spreader mounted on a copper heat sink that is subsequently cooled by chilled water or glycol. The diamond heat spreader can be a single-crystal or polycrystalline.

Single-crystal diamond is an effective heat spreader due to its high thermal conductivity. For example, single-crystal diamonds can be used as external heat spreaders or intracavity heat spreaders. Problems arise, however, because it is difficult to obtain a desirable low surface roughness. The low surface roughness is required to ensure a direct bonding of single-crystal diamond with high power devices without generating air gaps or voids at the interface. In addition, single-crystal diamonds are expensive.

Polycrystalline diamond is several orders of magnitude cheaper than single-crystal diamond, yet with comparable thermal conduction. Polycrystalline diamonds are often formed by chemical vapor deposition (CVD), which provides undesirable surface roughness. It is thus also a challenge for polycrystalline diamonds to obtain a desirable low surface roughness because polycrystalline diamonds have a similar hardness as single-crystal diamonds. Large voids can be generated at the interface of the polycrystalline diamonds and the high power devices. The poor thermal conduction due to the voids generated at the interface significantly hinders efficient heat transfer.

To address the surface roughness issues of the polycrystalline diamonds, conventional methods use capillary fluid (water or ethanol) and indium alloy solder to bond polycrystalline diamonds to high power devices. However, there is no efficient wetting of the rough surface of the polycrystalline diamonds for either the capillary fluid or the indium alloy solder. Voids are still generated at the interface of the diamonds and the high power devices.

Thus, there is a need to overcome these and other problems of the prior art and to provide methods for forming and integrating a diamond heat spreader with a heat source without generating voids at their interface.

SUMMARY OF THE INVENTION

According to various embodiments, the present teachings include a method for forming a heat spreader. In this method, a semiconductor layer can be epitaxially formed on a diamond substrate and can then be surface treated to provide a surface root mean square (RMS) roughness of about 5 nm or less suitable for bonding with a heat source.

According to various embodiments, the present teachings also include a method for integrating a heat spreader. In this method, a diamond substrate that includes a polycrystalline diamond substrate can be provided and a semiconductor layer that includes a Group III-V semiconductor epi-layer can be epitaxially grown on the diamond substrate. The Group III-V semiconductor epi-layer can then be surface treated to have a surface root mean square (RMS) roughness of less than about 5 nm for bonding to a heat source.

According to various embodiments, the present teachings further include a semiconductor device. The semiconductor device can include a diamond substrate, a semiconductor epi-layer on the diamond substrate, and a heat source on the semiconductor epi-layer. The semiconductor epi-layer can have a surface root mean square (RMS) roughness of about 5 nm or less and can have an interface free of voids with the heat source.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Various embodiments provide methods for forming a diamond heat spreader and integrating the diamond heat spreader with a heat source without generating voids at the interface. In one embodiment, a semiconductor layer can be epitaxially formed on a diamond substrate having a desirably low surface root mean square (RMS) roughness. The semiconductor epi-layer can be used as an interface layer for bonding the diamond substrate to the heat source to provide efficient heat spreading.

As used herein, unless otherwise specified, the term "without voids" or "free of voids" refers to a size level of voids generated at the interface between adjacent layers of the heat spreader integration, wherein the interfaces can be free of voids with an average void size larger than about several microns. For example, the interface between the heat source and the semiconductor epi-layer can be free of voids having an average void size larger than about 3 microns.

As used herein, the term "average void size" refers to the average size of any characteristic dimension of voids based on the shape of the voids. For example, the average void size can be given in terms of the diameter of substantially spherical voids or nominal diameter for irregular shaped voids. The voids can have any cross-sectional shapes including round, oblong, square, euhedral, etc.

Figure 1A:
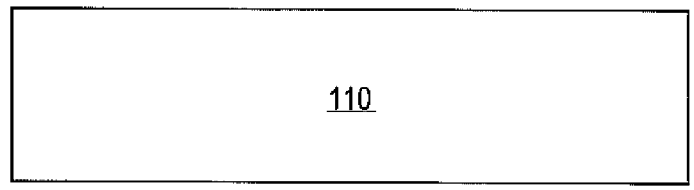
FIGS. 1A-1C depict an exemplary heat spreader at various fabrication and integration stages in accordance with various embodiments of the present teachings.
Figure 1B:
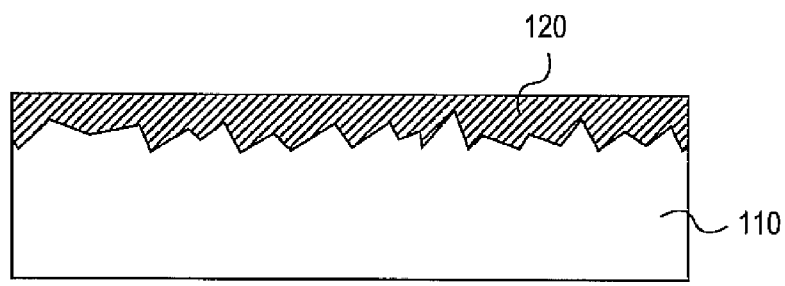
Figure 1C:
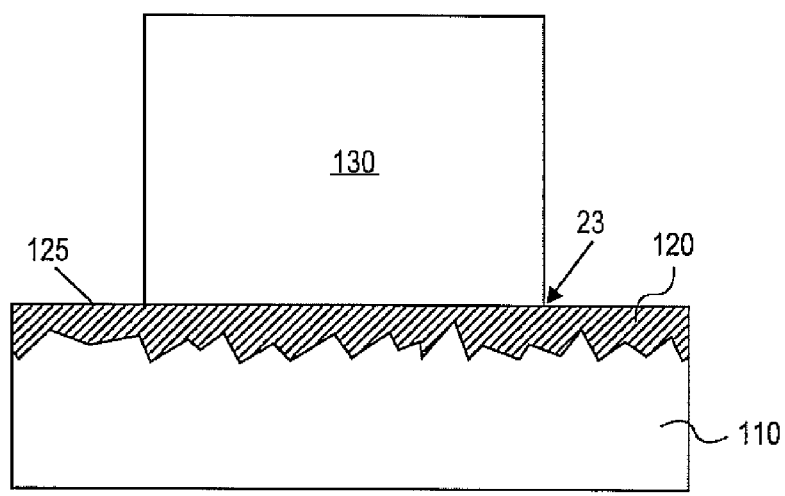

FIGS. 1A-1C depict an exemplary heat spreader at various fabrication and integration stages in accordance with various embodiments of the present teachings.

As shown in FIG. 1A, the device 100A can include a diamond substrate 110. In embodiments, the diamond substrate 110 can be a polycrystalline diamond substrate and/or a single-crystal diamond substrate. For example, the polycrystalline diamond substrate can be formed by a CVD process.

In embodiments, the diamond substrate 110 can include any conventional diamond heat spreaders regardless of its surface roughness due to the disclosed semiconductor epi-layer (see 120 in FIG. 1B). For example, the diamond substrate can have a high surface RMS roughness of about 50 nm. In one exemplary embodiment, the diamond substrate 110 can be Element 6® TM180® thermal management grade CVD diamond wafers (Element Six, NY), which have a thermal conductivity of about 1800 W/m-K.

In FIG. 1B, a semiconductor layer 120 can be epitaxially formed on the diamond substrate 110.

In various embodiments, the semiconductor epi-layer 120 can include one or more elements chosen from Group II, Group III, Group IV, Group V, and/or Group VI. In various embodiments, the semiconductor epi-layer 120 can be formed of a Group III-V material. Exemplary Group III elements can include Ga, In, and Al. Exemplary Group V elements can include As, P and N. For example, Group 11'-V materials formed on the diamond substrate 110 can include, but are not limited to, the binary alloys GaN, AlN, InN, GaP, AlP, InP, GaAs, AlAs, InAs, GaSb, AlSb, InSb, and all of their ternary, quaternary, and quintinary combinations.

In embodiments, the Group III-V material can be formed by various crystal growth techniques including, but not limited to, molecular-beam epitaxy (MBE), metal-organic chemical vapor deposition (MOCVD), gas source MBE (GSMBE), metal-organic MBE (MOMBE), atomic layer epitaxy (ALE), or hydride vapor phase epitaxy (HVPE). In one embodiment, the semiconductor layer 120 can be formed by a low-temperature molecular beam epitaxy (LT-MBE).

In embodiments, the semiconductor epi-layer 120 can be polycrystalline or amorphous. In one embodiment, the semiconductor epi-layer can be a polycrystalline GaAs thin layer.

In embodiments, the semiconductor epi-layer 120 can have a thickness of at least about 10 nm, for example, ranging from about 100 nm to about 5 μm. In embodiments, the epitaxial growth of the semiconductor layer 120, e.g., Group III-V semiconductor layer, on the diamond substrate 110, e.g., a CVD diamond, can lead to significant reduction in surface roughness.

In embodiments, the semiconductor epi-layer 120 can have a thermal conductivity of at least about 5 $Wm^{-1}K^{-1}$, for example, ranging from about 8 $Wm^{-1}K^{-1}$ to about 46 $Wm^{-1}K^{-1}$. In embodiments, the thermal conductivity of the semiconductor epi-layer can be controlled by the thickness of the layer. For example, the thermal conductivity of the semiconductor epi-layer can increase as the layer thickness increases due to dimension effects.

Following the epitaxial growth process, the semiconductor layer 120 can be surface treated to provide a receiving surface 125 for bonding with a heat source. The surface treated semiconductor epi-layer 120 can have a sub-nm surface RMS roughness, for example, about 10 nm or less, or less than about 5 nm, or ranging from about 1 nm to about 5 nm.

The surface treatment of the semiconductor epi-layer 120 can include a polishing process using, for example, a colloidal silica polishing suspension with a soft polishing pad, wherein colloidal silica in the polishing suspensions can have an average particle size ranging from about 0.04 μm to about 0.07 μm. Alternatively, the surface treatment of the semiconductor epi-layer 120 can include a chemical mechanical polishing (CMP) process or other polishing processes.

In FIG. 1C, the surface treated semiconductor epi-layer 120 can be used as an interface layer for bonding the diamond substrate 110 to a heat source 130 so as to efficiently dissipate or spread heat transferred from the heat source 130.

Various bonding processes can be used to bond the heat source 130 with the semiconductor epi-layer 120 including, for example, a capillary bonding process and/or a wafer-bonding process.

In embodiments, the heat source 130 can include, but is not limited to, a laser, a light emitting diode, an electronic high-power switch, and/or other semiconductor devices. The semiconductor devices that provide the heat source 130 can be formed of Group III-V materials, which can be bonded with the semiconductor epi-layer 120 on the diamond substrate 110.

In this manner, the epitaxial growth of the semiconductor layer can allow a direct contact between the semiconductor epi-layer 120 and the diamond substrate 110, and between the heat source 130 and the semiconductor epi-layer 120 substantially without voids at the interfaces thereof. Further, the epitaxial growth of the semiconductor layer 120 can overcome mismatch problems between the heat source and the diamond heat spreader as seen in conventional integration. Mismatch problems can include thermal expansion coefficient mismatch and lattice constant mismatch of materials that can generate microcracks and layer peeling. Furthermore, the semiconductor epi-layer grown on the diamond substrate can bond more effectively to a rough diamond surface and essentially eliminate void issues at the interface.

Even further, the semiconductor epi-layer, for example a polycrystalline GaAs layer, can be used as an improved thermal interface material (TIM) for diamond heat sinks over conventionally used indium solders, because the semiconductor epi-layer can have a controllable low thickness. For example, conventional indium solder TIMs have thicknesses on the order of several microns. Assuming a bulk thermal conductivity of indium is about 81.8 $W\ m^{-1}\ K^{-1}$, the thermal resistance of a 10 μm-thick-In TIM can be about $1.22 \times 10^{-7}$ $m^2\ K\ W^{-1}$. Although the thermal conductivities of the disclosed semiconductor epi-layer can be less than that of bulk indium, the required layer thickness of the semiconductor epi-layer can be much lower than the typical thickness of conventional In-TIMs. For example, a 100-nm polycrystalline GaAs layer can have a thermal resistance of about $1.2 \times 10^{-8}\ m^2\ K W^{-1}$, a thermal resistance that is a factor of 10 lower than conventional In-TIM.

EXAMPLES

Example 1

Formation of GaAs Epi-Layer on Diamond

Thin GaAs layers were epitaxially grown on a diamond substrate. The thin GaAs layers were grown using Low-Temperature Molecular Beam Epitaxy (LT-MBE) on Element 6® TM180® thermal management grade CVD diamond wafers (Element 6, NY), which have a thermal conductivity of about 1800 W/m-K. The epitaxially grown thin GaAs layers were used as wafer bonding interfaces to bond with desirable semiconductor devices for spreading heat via the underlying diamond substrate.

First, the surface residual contaminants on the diamond substrates were thermally removed by heating the substrates to a temperature of about 400° C. for about 30 minutes in a preparation chamber of a VG V80H MBE reactor. The diamond substrates were then transferred into the growth chamber where LT-GaAs can grow.

The diamond substrates were then maintained at a temperature of about 250° C., which was controlled by a substrate heater thermocouple. GaAs layers were grown having a III/V beam equivalent pressure ratio of about 1:8 and having a single crystal growth rate of about 0.2 μm/hr. A set of GaAs samples was grown with a layer thickness varying from about 100 nm to about 5 μm.

The GaAs layers grown on diamond were polished to achieve a smooth surface for a subsequent wafer bonding. The GaAs layers were polished with a soft polishing pad using a colloidal silica polishing suspension. The average particle size of colloidal silica in the polishing suspensions ranged from about 0.04 μm to about 0.07 μm. As a result, the formed LT-GaAs layers were adhered to the diamond with no chipping or layer flaking observed. Alternatively, further surface roughness reductions can be achieved using a chemical mechanical polishing (CMP) process.

Example 2

Characterization of GaAs Epi-Layer on Diamond

Reflection high-energy electron diffraction (RHEED) was used to monitor the diamond substrate and the GaAs layer during its growth. The RHEED measurements set the electron gun at about 12.4 kV and a beam current to about 1.4 A. Resultant RHEED patterns (not shown) indicated that the diamond substrate in this example was a highly polycrystalline substrate; and the grown GaAs layer was polycrystalline or included a mixture of amorphous and polycrystalline GaAs.

Atomic force microscopy (AFM) was used to observe the diamond substrate and the GaAs growth. Surface RMS roughness of a CVD diamond substrate varied between 50 to 100 nm. The growth of LT-GaAs layers on the CVD diamond led to a significant reduction in surface roughness. In one example, AFM images of LT-GaAs on diamond showed that the surface RMS roughness of the GaAs layer was reduced to about 10-15 nm. The smoothness of the GaAs surface can be further increased by polishing to achieve a surface RMS roughness of about 3-5 nm.

The polycrystalline nature of the grown GaAs layer was confirmed by powder X-ray diffraction (XRD), where the diffraction pattern was recorded using non-monochromatic Cu Kalpha2 radiation on a Panalytical powder diffractometer, and the Cu Kapha2 contribution was subtracted for clarity. For an omega-2theta scan of a 5-μm-thick GaAs growth on a CVD diamond, reflections of GaAs (111), (220), and (311) were developed in addition to the diamond (111) reflection. No other phases were observed for the GaAs layer, although an amount of amorphous GaAs was shown in the XRD results.

The thermal conductivity of the polycrystalline GaAs layers was measured by a pump-probe time domain thermoreflectance (TDTR) setup. In the measurements, polycrystalline GaAs layers were coated with a 100-nm Al transducer layer. The pump-heating event was modulated at 11 MHz to make the effects of radial transport negligible, ensuring that the cross plane thermal conductivity of the thin polycrystalline GaAs layer was accurately resolved. Assuming GaAs layers have a heat capacity of about 1.74 $MJm^{-3}K^{-1}$, the thermal conductivities of 1-μm, 500-nm, and 100-nm thick polycrystalline GaAs layers were about 14.5, 10.4, and 8.1 $Wm^{-1}K^{-1}$, respectively.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method comprising:
providing a diamond substrate having a major surface;
growing a semiconductor interface layer on the major surface of the diamond substrate using an epitaxial growth technique, the semiconductor interface layer being in a form selected from amorphous, polycrystalline or both amorphous and polycrystalline forms, the interface layer providing a smoother and softer surface compared to the major surface of the diamond substrate;
surface treating the semiconductor interface layer to provide the semiconductor interface layer with a surface root mean square (RMS) roughness of about 5 nm or less, the semiconductor interface layer and diamond substrate forming a heat spreader; and bonding a heat source to the surface treated semiconductor interface layer of the heat spreader, the heat source comprising a semiconductor device, the semiconductor interface layer of the heat spreader configured to provide an increased rate of heat transfer between the heat source and the heat spreader than would be achieved by the diamond substrate without the surface treated semiconductor interface layer.

2. The method of claim 1, wherein the semiconductor interface layer comprises an alloy material selected from the group consisting of a binary alloy, a ternary alloy, a quaternary alloy, a quintinary alloy, and a combination thereof, wherein the alloy material comprises GaN, ALN, InN, GaP, AlP, InP, GaAs, AlAs, InAs, GaSb, AlSb, InSb, or a combination thereof.

3. The method of claim 1, wherein the semiconductor interface layer has a thickness ranging from about 100 nm to about 5 μm.

4. The method of claim 1, wherein the semiconductor interface layer has a thermal conductivity of at least about 5 $Wm^{-1}K^{-1}$.

5. The method of claim 1, further comprising surface treating the semiconductor interface layer by one or more of a chemical mechanical polishing (CMP) process and a process using a colloidal silica polishing suspension with a soft polishing pad.

6. The method of claim 1, wherein the surface treated semiconductor interface layer provides a surface for capillary bonding or wafer bonding with the heat source without generating voids having an average size larger than about 3 microns at an interface of the semiconductor interface layer and the heat source.

7. The method of claim 1, wherein the diamond substrate is a polycrystalline diamond substrate or a single-crystal diamond substrate.

8. The method of claim 1, further comprising bonding a heat source to the semiconductor interface layer.

9. A method for integrating a heat spreader comprising:
providing a diamond substrate comprising a polycrystalline diamond substrate;
growing a Group III-V semiconductor interface layer on the diamond substrate using an epitaxial growth technique, the semiconductor interface layer being in a form selected from amorphous, polycrystalline or both amorphous and polycrystalline forms; wherein the Group III-V semiconductor interface layer comprises a Group III-V material;
surface treating the Group III-V semiconductor interface layer to provide a surface root mean square (RMS) roughness of less than about 5 nm; and
bonding the surface treated Group III-V semiconductor interface layer to a heat source, the semiconductor interface layer of the heat spreader configured to provide an increased rate of heat transfer between the heat source and the heat spreader than would be achieved by the diamond substrate without the surface treated semiconductor interface layer.

10. The method of claim 9, wherein the Group III-V material comprises an alloy material selected from the group consisting of a binary alloy, a ternary alloy, a quaternary alloy, a quintinary alloy, and a combination thereof, wherein the alloy material comprises GaN, ALN, InN, GaP, AlP, InP, GaAs, AlAs, InAs, GaSb, AlSb, InSb, or a combination thereof.

11. The method of claim 9, wherein epitaxially growing the Group III-V semiconductor interface layer comprises growing a GaAs layer at a crystal growth rate of about 0.2 μm/hr on the diamond substrate of about 250° C., and wherein the growth of the GaAs layer has a Group III:V beam flux ratio of about 1:8.

12. The method of claim 9, wherein the Group III-V semiconductor interface layer has a thermal conductivity ranging from about 8 $Wm^{-1}K^{-1}$ to about 46 $Wm^{-1}K^{-1}$.

13. The method of claim 9, wherein surface treating the Group III-V semiconductor interface layer comprises a process using a colloidal silica polishing suspension with a soft polishing pad, wherein the colloidal silica has an average particle size ranging from about 0.04 μm to about 0.07 μm.

14. The method of claim 9, wherein surface treating the Group III-V semiconductor interface layer comprises a chemical mechanical polishing process.

15. The method of claim 9 further comprising a capillary bonding or a wafer bonding of the surface treated Group III-V semiconductor interface layer to the heat source.

16. A method for forming a heat spreader comprising:
providing a polycrystalline diamond substrate;
growing a semiconductor interface layer on the diamond substrate using an epitaxial growth technique, the semiconductor interface layer comprises an alloy material selected from the group consisting of a binary alloy, a ternary alloy, a quaternary alloy, a quintinary alloy, and a combination thereof, wherein the alloy material comprises GaN, ALN, InN, GaP, AlP, InP, GaAs, AlAs, InAs, GaSb, AlSb, InSb, or a combination thereof, wherein the semiconductor interface layer is in a form selected from amorphous, polycrystalline or both amorphous and polycrystalline forms; and
polishing the semiconductor interface layer to provide the semiconductor interface layer with a surface root mean square (RMS) roughness of about 5 nm or less, the polished semiconductor interface layer and diamond substrate being configured to act as a heat spreader for a high power semiconductor device.

17. The method of claim 1, wherein the heat source comprises a laser, a light emitting diode, an electronic high-power switch or a combination thereof.

18. The method of claim 9, wherein the heat source comprises a laser, a light emitting diode, an electronic high-power switch or a combination thereof.

19. The method of claim 1, wherein the epitaxial growth technique is selected is one of molecular-beam epitaxy (MBE), metal-organic chemical vapor deposition (MOCVD), gas source MBE (GSMBE), metal-organic MBE (MOMBE), atomic layer epitaxy (ALE), or hydride vapor phase epitaxy (HVPE).

20. The method of claim 1, wherein the epitaxial growth technique is low-temperature molecular beam epitaxy (LT-MBE).

* * * * *